(12) United States Patent
Xu et al.

(10) Patent No.: US 11,304,296 B2
(45) Date of Patent: Apr. 12, 2022

(54) SUBSTRATE, ELECTRONIC DEVICE, AND BONDING METHOD

(71) Applicant: SHENZHEN ROYOLE TECHNOLOGIES CO., LTD., Guangdong (CN)

(72) Inventors: Zhigao Xu, Guangdong (CN); Hewen Shen, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 22 days.

(21) Appl. No.: 17/041,391

(22) PCT Filed: Apr. 28, 2018

(86) PCT No.: PCT/CN2018/085115
§ 371 (c)(1),
(2) Date: Sep. 24, 2020

(87) PCT Pub. No.: WO2019/205150
PCT Pub. Date: Oct. 31, 2019

(65) Prior Publication Data
US 2021/0076494 A1 Mar. 11, 2021

(51) Int. Cl.
| | |
|---|---|
| *H05K 1/11* | (2006.01) |
| *H05K 3/36* | (2006.01) |
| *H05K 1/02* | (2006.01) |
| *H05K 1/14* | (2006.01) |

(52) U.S. Cl.
CPC ............ *H05K 1/111* (2013.01); *H05K 1/028* (2013.01); *H05K 1/144* (2013.01); *H05K 1/147* (2013.01); *H05K 3/361* (2013.01); *H05K 2201/041* (2013.01); *H05K 2201/09418* (2013.01); *H05K 2203/166* (2013.01)

(58) Field of Classification Search
CPC .................... H05K 1/11–119; H05K 3/361
See application file for complete search history.

(56) References Cited

U.S. PATENT DOCUMENTS

2012/0251757 A1  10/2012 Dalmis et al.

FOREIGN PATENT DOCUMENTS

| CN | 102364679 A | 2/2012 |
|---|---|---|
| CN | 103983688 A | 8/2014 |
| CN | 206608789 U | 11/2017 |

OTHER PUBLICATIONS

International Search Report issued in International Application No. PCT/CN2018/085115, dated Feb. 11, 2019, pp. 1-2, State Intellectual Property Office of the P.R. China, Beijing, China.

*Primary Examiner* — Jeremy C Norris
(74) *Attorney, Agent, or Firm* — Hauptman Ham, LLP

(57) ABSTRACT

A substrate is provided. The substrate includes a bottom plate and at least one bonding portion disposed on the bottom plate, where each bonding portion takes a shape that is a part of an Archimedean spiral. An electronic device, a bonding structure, and a bonding method for the bonding structure are further provided.

17 Claims, 4 Drawing Sheets

SUBSTRATE, ELECTRONIC DEVICE, AND BONDING METHOD

TECHNICAL FIELD

This disclosure relates to the field of display technology, and particularly to a substrate, an electronic device, a bonding structure, and a bonding method for the bonding structure.

BACKGROUND

In the electronic industry, bonding among substrates is a common process. For example, in a flexible display device, a flexible printed circuit (FPC) is bonded to a substrate of a flexible display panel to input electrical signals. However, it is easy to cause misalignment during bonding due to different thermal expansion coefficients of different materials, resulting in poor bonding.

SUMMARY

In view of the above deficiencies, implementations of the disclosure provide a substrate, an electronic device, a bonding structure, and a bonding method for the bonding structure.

A substrate is provided. The substrate includes a bottom plate and at least one bonding portion disposed on the bottom plate. Each bonding portion takes a shape that is a part of an Archimedean spiral.

In one implementation, the substrate has a first axis. The at least one bonding portion includes at least one first bonding portion and at least one second bonding portion. The at least one first bonding portion is disposed at one side of the first axis, and the at least one second bonding portion is disposed at the other side of the first axis.

In one implementation, the at least one first bonding portion and the at least one second bonding portion are arranged at intervals along a second axis, and the first axis intersects the second axis.

In one implementation, the at least one first bonding portion is in one-to-one correspondence with the at least one second bonding portion. Each first bonding portion and a corresponding second bonding portion are symmetrical with each other with respect to an intersection point of the first axis and the second axis.

In one implementation, the first axis is perpendicular to the second axis.

In one implementation, the at least one bonding portion comprises a plurality of first bonding portions, where all the plurality of first bonding portions locate at a same Archimedean structure.

In one implementation, the substrate is a flexible substrate.

A bonding structure is provided. The bonding structure includes a first substrate and a second substrate bonded to the first substrate. The first substrate includes a bottom plate and at least one bonding portion disposed on the bottom plate of the first substrate. The second substrate includes a bottom plate and at least one bonding portion disposed on the bottom plate of the second substrate. Each bonding portion of the first substrate is bonded to a corresponding bonding portion of the second substrate. At least one of the first substrate and the second substrate is the above substrate.

In one implementation, each two adjacent bonding portions of the first substrate are arranged at an interval equal to that at which two corresponding adjacent bonding portions of the second substrate are arranged.

In one implementation, the bonding portion of one of the first substrate and the second substrate takes a shape that is a part of an Archimedean spiral, and the bonding portion of the other substrate is in the shape of an arc.

In one implementation, the first substrate is a flexible display panel, and the second substrate is a flexible printed circuit.

An electronic device is provided. The electronic device includes the above bonding structure.

A bonding method for the above bonding structure is provided. The method includes the following. Perform an initial alignment for the second substrate and the first substrate. Perform a second alignment for the second substrate. Each bonding portion of the first substrate is bonded to a corresponding bonding portion of the second substrate.

In one implementation, performing the initial alignment for the second substrate and the first substrate is as follows. Align a first axis of the bottom plate of the second substrate with a first axis of the bottom plate of the first substrate and align a second axis of the bottom plate of the second substrate with a second axis of the bottom plate of the first substrate to perform the initial alignment.

In one implementation, performing the second alignment for the second substrate is as follows. The second substrate is rotated by a first angle around a center point to perform the second alignment, where the center point is an intersection point of a first axis of the second substrate and a second axis of the second substrate.

In one implementation, the first angle is expressed as $$\Delta \sigma = \frac{\Delta L}{b},$$

where $\Delta L = L - L'$, and b is a real number, where L is assumed to be a difference of the bonding portion of the first substrate caused by thermal expansion along a direction parallel to the second axis of the first substrate, and L' is assumed to be a difference of the bonding portion of the second substrate caused by thermal expansion along a direction parallel to the second axis of the second substrate.

According to the substrate, the electronic device, the bonding structure, and the bonding method for the bonding structure provided in the disclosure, since the bonding portion of the substrate takes a shape that is a part of an Archimedean spiral, the substrate can be rotated for adjustment when the substrate is bonded, so that the problem of misalignment caused by factors such as thermal expansion of the bonding portion of the substrate can be avoided. As such, a precision of alignment between the substrates can be improved, and thus a precision of bonding the substrates can be improved.

BRIEF DESCRIPTION OF THE DRAWINGS

In order to describe technical solutions of implementations of the disclosure more clearly, the following will give a brief description of accompanying drawings used for describing the implementations. Apparently, accompanying drawings described below are merely some implementations. Those of ordinary skill in the art can also obtain other accompanying drawings based on the accompanying drawings described below without creative efforts.

DETAILED DESCRIPTION

Hereinafter, technical solutions embodied by implementations of the disclosure will be described in a clear and comprehensive manner with reference to the accompanying drawings intended for the implementations. It is evident that the implementations described herein constitute merely some rather than all the implementations of the disclosure, and that those of ordinary skill in the art will be able to derive other implementations based on these implementations without making creative efforts, which all such derived implementations shall all fall in the protection scope of the disclosure.

Figure 1:
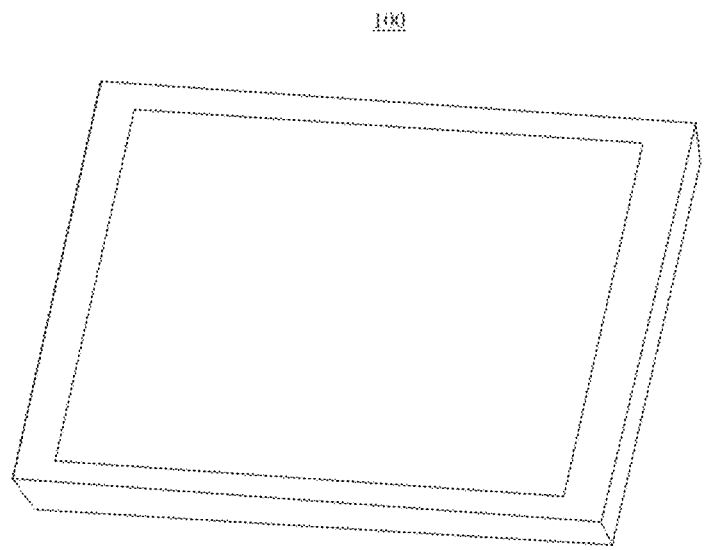
FIG. 1 is a schematic view illustrating an electronic device according to an implementation of the disclosure.

As illustrated in FIG. 1, an electronic device 100 is provided according to an implementation of the disclosure. In this implementation, the electronic device 100 is a flexible display device. It can be understood that, the electronic device 100 may be other electronic devices, such as a non-flexible display device.

Figure 2:
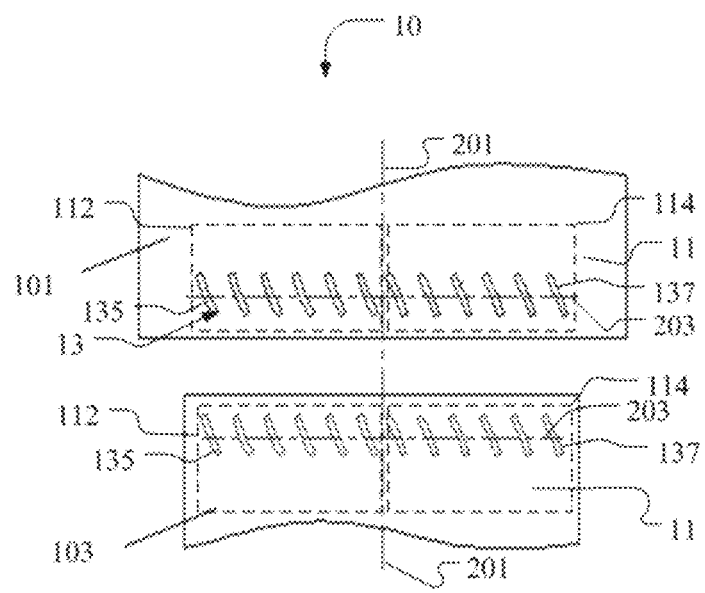
FIG. 2 is an exploded schematic view illustrating a bonding structure of the electronic device illustrated in FIG. 1.

As illustrated in FIG. 2, the electronic device 100 includes a bonding structure 10. The bonding structure 10 includes a first substrate 101 and a second substrate 103 bonded to the first substrate 101. Both the first substrate 101 and the second substrate 103 include a bottom plate 11 and at least one bonding portion 13 disposed on the bottom plate 11. Each bonding portion 13 of the first substrate 101 is bonded to a corresponding bonding portion 13 of the second substrate 103.

In this implementation, the first substrate 101 and the second substrate 103 are both flexible substrates, where the first substrate 101 is a flexible display panel, and the second substrate 103 is a flexible printed circuit. It can be understood that, the first substrate 101 may be a rigid substrate, and the second substrate 103 may also be a rigid substrate, and electronic components such as chips may be attached to the second substrate 103.

The bonding portion 13 is a pad provided on the bottom plate 11. Each bonding portion 13 of the first substrate 101 is bonded to a corresponding bonding portion 13 of the second substrate 103 by welding. It can be understood that, in other implementations, the bonding portion 13 may be an adhesive member, or the bonding portion 13 may be a hole or groove.

In this implementation, the material of the bottom plate 11 of the first substrate 101 is different from the material of the bottom plate 11 of the second substrate 103. Hereinafter, the first substrate 101 will be described in detail.

In one implementation, the bottom plate 11 has a first axis 201 and a second axis 203 perpendicular to the first axis 201.

In this implementation, each bonding portion 13 takes a shape that is a part of an Archimedean spiral.

The at least one bonding portion 13 is arranged along the second axis 203. Taking one bonding portion 13 as an example, an Archimedean spiral polar coordinate formula is expressed as:

$$r = a + b\theta \quad (1),$$

where both a and b are real numbers.

Formula (1) is converted into Cartesian coordinates expressed as:

$$x = (\alpha + \beta\theta)\cos\theta, \quad (2)$$

$$y = (\alpha + \beta\theta)\sin\theta, \quad (3)$$

then $$\theta = \arctan\left(\frac{y}{x}\right), \quad (4)$$

where θ is an angle of a certain point on the bonding portion 13 relative to an origin of an Archimedean spiral where the bonding portion 13 locates.

An interval at which each two adjacent bonding portions 13 of the first substrate 101 are arranged is equal to an interval at which two corresponding adjacent bonding portions 13 of the second substrate 103 are arranged, to ensure bonding accuracy.

Furthermore, the bottom plate 11 includes a first bonding area 112 and a second bonding area 114. The first bonding area 112 is disposed at one side of the first axis 201, and the second bonding area 114 is disposed at the other side of the first axis 201. In other words, the first bonding area 112 and the second bonding area 114 are respectively disposed at two sides of the first axis 201.

The at least one bonding portion 13 includes at least one first bonding portion 135 and at least one second bonding portion 137. The first bonding portion 135 is disposed in the first bonding area 112. The second bonding portion 137 is disposed in the second bonding area 114. Each first bonding portion 135 and a corresponding second bonding portion 137 are symmetrical with each other with respect to an intersection point of the first axis 201 and the second axis 203.

Furthermore, the at least one first bonding portion 135 and the at least one second bonding portion 137 are arranged along the second axis 203.

Each first bonding portion 135 of the first substrate 101 is bonded to a corresponding first bonding portion 135 of the second substrate 103. Each second bonding portion 137 of the first substrate 101 is bonded to a corresponding second bonding portion 137 of the second substrate 103. Since on the same substrate each first bonding portion 135 and a corresponding second bonding portion 137 are centrally symmetrical with each other, a precision of alignment between the first substrate 101 and the second substrate 103 can be further improved, and thus bonding precision can be improved.

In one implementation, on the same substrate the bonding portions 13 in the same bonding area (e.g., the first bonding portions 135 on the first substrate 101) locate at a same Archimedean spiral, which can improve the bonding precision. It can be understood that, when two or more bonding portions are provided, on the same substrate the bonding portions 13 may all locate at a same Archimedean spiral. For example, the first bonding portions 135 and the second bonding portions 137 of the first substrate 101 locate at a same Archimedean spiral. In this case, the first bonding portions 135 and the second bonding portions 137 are not centrally symmetrical.

Since the material of the first substrate 101 is different from that of the second substrate 103, during bonding, the bonding portions 13 of the first substrate 101 and the bonding portions 13 of the second substrate 103 may contract inwardly or expand outwardly under high temperature (e.g., 170-200 degrees). Therefore, it is necessary to correct the size of the bonding portion 13 of the first substrate 101 and a corresponding bonding portion 13 of the second substrate 103.

Along a direction parallel to the second axis 203 of the first substrate 101, a difference (inward contraction or outward expansion) of the bonding portion 13 of the first substrate 101 caused by thermal expansion is expressed as L for example. Along a direction parallel to the second axis 203 of the second substrate 103, a difference (inward contraction or outward expansion) of the bonding portion 13 of the second substrate 103 caused by thermal expansion is expressed as L' for example. Since material expansion coefficients of the first substrate 101 and the second substrate 103 are different, L≠L' (i.e., L is not equal to L'). In this case, along the direction parallel to the second axis 203 of the first substrate 101, a correction value ΔL can be expressed as ΔL=L−L'. It can be understood that, L and L' can be obtained through actual measurements, experiments, calculation simulation, or other manners.

Figure 3:
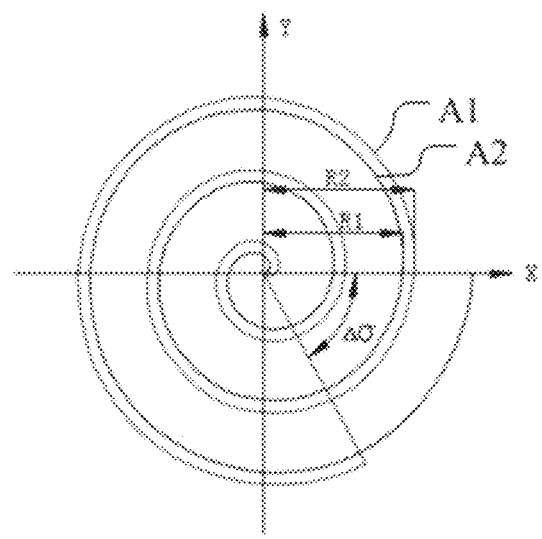
FIG. 3 is a schematic view illustrating an Archimedean spiral where a bonding portion of a first substrate locates and an Archimedean spiral where a corresponding bonding portion, subjected to expansion, of a second substrate locates.

FIG. 3 is a schematic view illustrating an Archimedean spiral where a bonding portion 13 of the first substrate 101 locates and an Archimedean spiral where a corresponding bonding portion 13 of the second substrate 103 locates, where A1 represents the Archimedean spiral where the bonding portion 13 of the first substrate 101 locates, and A2 represents the Archimedean spiral where the corresponding bonding portion 13 of the second substrate 103 locates.

Since both the bonding portion 13 of the first substrate 101 and the bonding portion 13 of the second substrate 103 locate part of an Archimedean spiral, the second substrate 103 is rotated by a first angle Δσ around a center point, so that each bonding portion 13 of the second substrate 103 is aligned with a corresponding bonding portion 13 of the first substrate 101. The center point may be an intersection point of the first axis 201 of the second substrate 103 and the second axis 203 of the second substrate 103, and may also be an intersection point of the first axis 201 of the first substrate 101 and the second axis 203 of the first substrate 101.

Since $$\Delta L = L - L' = R2 - R1 = a + b\sigma 2 - (a + b\sigma 1) = b\Delta\sigma, \quad (5)$$

then the first angle is expressed as:

$$\Delta\sigma = \frac{\Delta L}{b}. \quad (6)$$

To bond each bonding portion 13 of the first substrate 101 to a corresponding bonding portion 13 of the second substrate 103, an initial alignment is first performed for the first substrate 101 and the second substrate 103 as follows. The first axis 201 of the second substrate 103 is aligned with the first axis 201 of the first substrate 101, and the second axis 203 of the second substrate 103 is aligned with the second axis 203 of the first substrate 101. Then the second substrate 103 is rotated by the first angle Δσ around the center point to perform second alignment. In this implementation, a position of the first substrate 101 is kept unchanged during the second alignment. Finally, each bonding portion 13 of the first substrate 101 is bonded to a corresponding bonding portion 13 of the second substrate 103. It can be understood that, in the second alignment, what is needed is that the second substrate 103 is rotated, around the center point, by the first angle Δσ relative to the first substrate 101.

Figure 4:
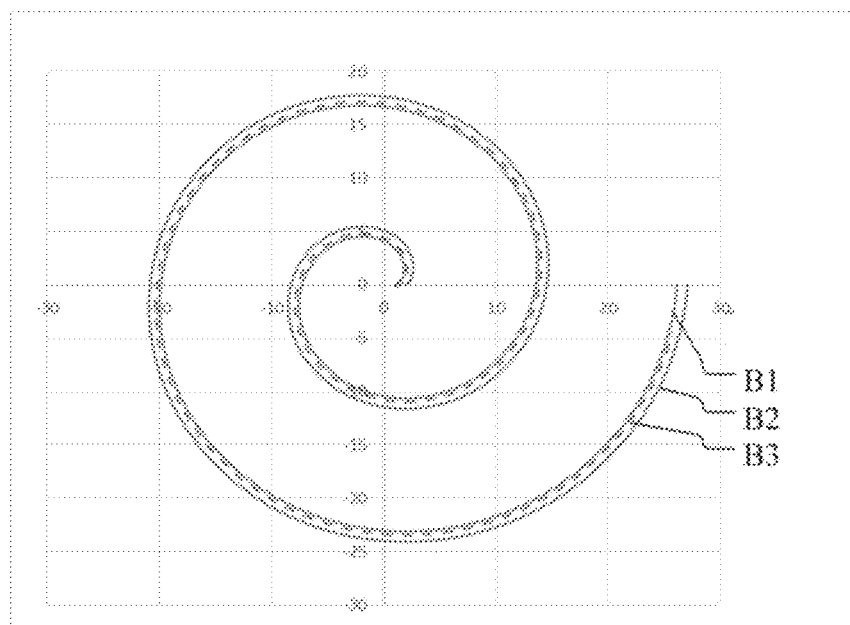
FIG. 4 is a schematic view illustrating rotation and expansion of an Archimedean spiral.

FIG. 4 is a schematic diagram illustrating rotation and expansion of an Archimedean spiral, where B1 represents an Archimedean spiral before expansion, B2 represents an Archimedean spiral after expansion, and B3 represents an Archimedean spiral after rotation. Since both the bonding portion 13 of the first substrate 101 and the bonding portion 13 of the second substrate 103 take a shape of an arc that is a part of an Archimedean spiral, each bonding portion 13 of the first substrate 101 can be well bonded to a corresponding bonding portion 13 of the second substrate 103 after the second alignment.

Figure 5:
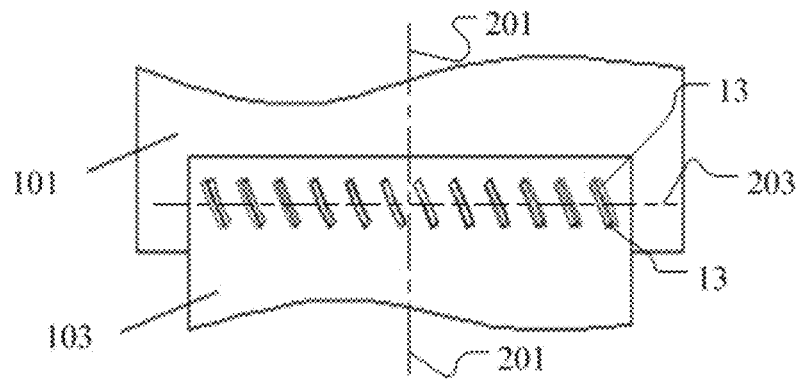
FIG. 5 is a schematic view illustrating initial alignment between the first substrate and the second substrate.
Figure 6:
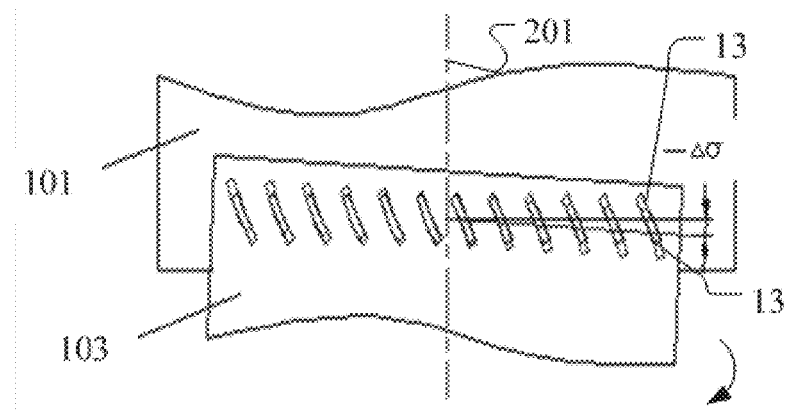
FIG. 6 is a schematic view illustrating second alignment by rotating the second substrate relative to the first substrate.

Furthermore, as illustrated in FIG. 5, when an expansion coefficient of the bottom plate 11 of the first substrate 101 is smaller than an expansion coefficient of the bottom plate 11 of the second substrate 103, in the initial alignment, it is apparent that misalignment occurs between each bonding portion 13 of the first substrate 101 and a corresponding bonding portion 13 of the second substrate 103. The farther one bonding portion 13 of the second substrate 103 is from the first axis 201 of the second substrate 103, the greater the degree of misalignment that occurs between the bonding portion 13 of the second substrate 103 and a corresponding bonding portion 13 of the first substrate 101. As illustrated in FIG. 6, the second substrate 103 is rotated clockwise around the center point by the first angle Δσ.

When the expansion coefficient of the bottom plate 11 of the first substrate 101 is larger than that of the bottom plate 11 of the second substrate 103, the second substrate 103 is rotated counterclockwise about the center point by the first angle Δσ.

It should be understood that, even if the first substrate 101 and the second substrate 103 have a same material, due to the influence generated by other external factors such as manufacturing processes of the first substrate 101 and the second substrate 103, the first substrate 101 and the second substrate 103 may still need to be corrected before bonding.

Since both the bonding portion 13 of the first substrate 101 and the bonding portion 13 of the second substrate 103 take a shape that is a part of an Archimedean spiral, if the bonding portion 13 of the first substrate 101 and bonding portion 13 of the second substrate 103 contract inwardly or expand outwardly due to thermal expansion, the first substrate 101 or the second substrate 103 can be slightly adjusted by rotating a certain angle during alignment, to avoid bonding misalignment, thereby improving bonding precision. Since an Archimedean spiral has a characteristic that a distance increases as an angle increases, alignment adjustment can be achieved through rotating an angle, as such, alignment difference between the first substrate 101 and the second substrate 103 due to thermal expansion can be corrected.

Figure 7:
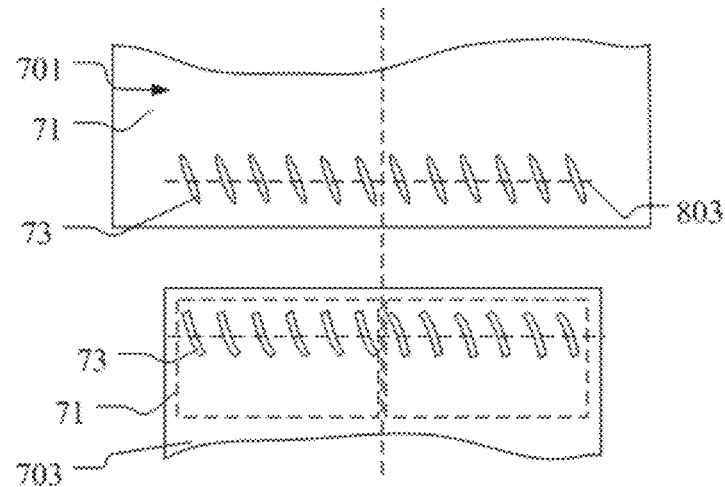
FIG. 7 is a schematic view illustrating a first substrate and a second substrate of a bonding structure according to another implementation of the disclosure.

FIG. 7 illustrates a bonding structure 70 according to another implementation of the disclosure. The bonding structure 70 includes a first substrate 701 and a second substrate 703 that are bonded together. Both the first substrate 701 and the second substrate 703 include a bottom plate 71 and at least one bonding portion 73 disposed on the bottom plate 71. Each bonding portion 73 of the first substrate 701 is bonded to a corresponding bonding portion 73 of the second substrate 703. The second substrate 703 illustrated in this implementation has a same structure as the second substrate 103 illustrated in the first implementation, that is, the bonding portion 73 of the second substrate 703 takes a shape that is a part of an Archimedean spiral. The first substrate 701 illustrated in this implementation is substantially the same as the first substrate 101 illustrated in the first implementation in structure. The first substrate 701 differs from the first substrate 101 in that the bonding portion 73 of the first substrate 701 does not take a shape that is a part of an Archimedean spiral. The bonding portion 73 of the first substrate 701 is in the shape of an ellipse.

Furthermore, the at least one bonding portion 73 of the first substrate 701 is arranged obliquely along a second axis 803. It can be understood that, the bonding portion 73 of the first substrate 701 may be in the shape of a circle, or may be partially arc-shaped, which is not limited herein.

An interval at which each two adjacent bonding portions 73 of the first substrate 701 are arranged is equal to an interval at which two corresponding adjacent bonding portions 73 of the second substrate are arranged, to ensure bonding accuracy.

Figure 8:
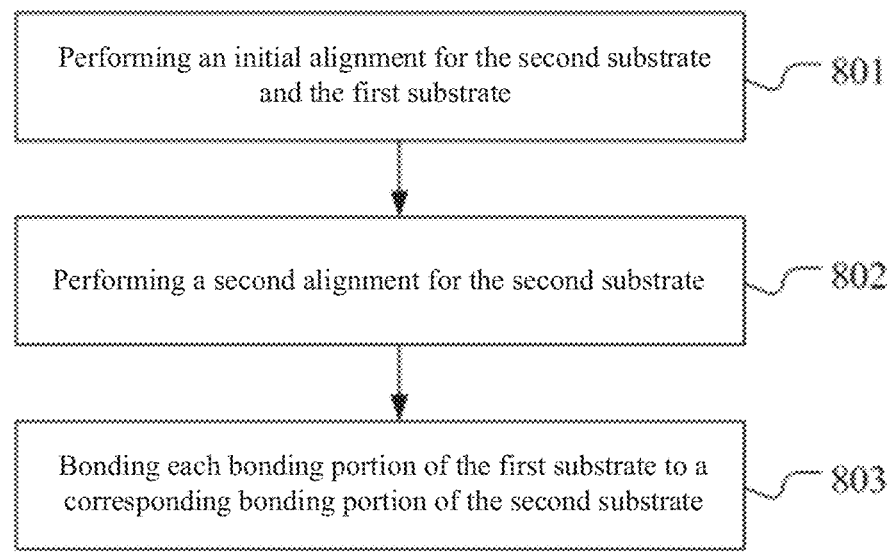
FIG. 8 is a schematic flow chart illustrating a bonding method for a bonding structure.

FIG. 8 illustrates a bonding method for a bonding structure. The bonding structure includes a first substrate and a second substrate. The bonding method includes the following.

At block 201, perform an initial alignment for the second substrate and the first substrate.

In one implementation, a first axis of the second substrate is aligned with a first axis of the first substrate, and a second axis of the second substrate is aligned with a second axis of the first substrate, so as to perform the initial alignment.

At block 202, perform a second alignment for the second substrate.

In one implementation, the second substrate is rotated by a first angle around a center point to perform the second alignment, where the center point is an intersection point of the first axis of the second substrate and the second axis of the second substrate.

At block 203, each bonding portion of the first substrate is bonded to a corresponding bonding portion of the second substrate.

Furthermore, the second substrate is rotated by the first angle around the center point as follows. When an expansion coefficient of a bottom plate of the first substrate is smaller than an expansion coefficient of a bottom plate of the second substrate, the second substrate is rotated clockwise around the center point by the first angle. When the expansion coefficient of the bottom plate of the first substrate is greater than the expansion coefficient of the bottom plate of the second substrate, the second substrate is rotated counterclockwise around the center point by the first angle.

Furthermore, the bonding portion of the first substrate takes a shape that is a part of an Archimedean spiral, the bonding portion of the second substrate takes a shape that is a part of an Archimedean spiral, and the first angle can be expressed as $$\Delta \sigma = \frac{\Delta L}{b},$$

where $\Delta L$ is a distance between each bonding portion of the first substrate and a corresponding bonding portion of the second substrate along the second axis after the initial alignment, and b is a real number.

In one implementation, the bonding portion of the second substrate takes a shape that is a part of an Archimedean spiral, and the bonding portion of the first substrate does not take a shape that is a part of an Archimedean spiral. It can be understood that, the bonding portion of the first substrate may also be in the shape of an ellipse, in the shape of a circle, or may be partially arc-shaped, which is not limited herein.

Furthermore, the at least one bonding portion of the first substrate is arranged obliquely along the second axis. An interval at which each two adjacent bonding portions of the first substrate are arranged is equal to an interval at which two corresponding adjacent bonding portions of the second substrate are arranged, to ensure bonding accuracy.

For the substrate, the electronic device, the bonding method for the substrates provided in the disclosure, when a substrate needs to be bonded to another substrate or an electronic component, since each bonding portion of each substrate is in the shape of an arc, the substrate can be rotated, so that misalignment between bonding portions of the substrates caused by thermal expansion or other factors can be avoided, thereby improving a precision of alignment between the substrates and improving a precision of bonding the substrates. In addition, on the same substrate a first bonding portion and a corresponding second bonding portion are centrally symmetrical, which can further improve the precision of the alignment between the substrate and a second substrate, thereby improving bonding precision. As such, it is beneficial to improving production yield and use reliability of the electronic device.

While the disclosure has been described above in detail with reference to illustrative implementations, it is to be understood that those of ordinary skill in the art will be able to make several improvements and modifications. Any improvements or modifications made thereto without departing from the spirits and principles of the disclosure shall all fall in the protection scope of the disclosure.

What is claimed is:

1. A substrate, comprising:
a bottom plate; and
at least one bonding portion disposed on the bottom plate, wherein each bonding portion takes a shape that is a part of an Archimedean spiral.

2. The substrate of claim 1, wherein
the substrate has a first axis; and
the at least one bonding portion comprises at least one first bonding portion and at least one second bonding portion, wherein the at least one first bonding portion is disposed at one side of the first axis, and the at least one second bonding portion is disposed at the other side of the first axis.

3. The substrate of claim 2, wherein the at least one first bonding portion and the at least one second bonding portion are arranged at intervals along a second axis, and the first axis intersects the second axis.

4. The substrate of claim 3, wherein the at least one first bonding portion is in one-to-one correspondence with the at least one second bonding portion, and each first bonding portion and a corresponding second bonding portion are symmetrical with each other with respect to an intersection point of the first axis and the second axis.

5. The substrate of claim 4, wherein the at least one bonding portion comprises a plurality of first bonding portions, wherein all the plurality of first bonding portions locate at a same Archimedean spiral.

6. The substrate of claim 1, wherein the substrate is a flexible substrate.

7. An electronic device, comprising:
a first substrate comprising a bottom plate and at least one bonding portion disposed on the bottom plate of the first substrate; and
a second substrate bonded to the first substrate and comprising a bottom plate and at least one bonding portion disposed on the bottom plate of the second substrate;
wherein each bonding portion of the first substrate is bonded to a corresponding bonding portion of the second substrate; and
wherein each bonding portion of at least one of the first substrate and the second substrate takes a shape that is a part of an Archimedean spiral.

8. The electronic device of claim 7, wherein each two adjacent bonding portions of the first substrate are arranged at an interval equal to that at which two corresponding adjacent bonding portions of the second substrate are arranged.

9. The electronic device of claim 7, wherein the first substrate is a flexible display panel, and the second substrate is a flexible printed circuit.

10. The electronic device of claim 7, wherein
the first substrate has a first axis; and
the at least one bonding portion of the first substrate comprises at least one first bonding portion and at least one second bonding portion, wherein the at least one first bonding portion is disposed at one side of the first axis, and the at least one second bonding portion is disposed at the other side of the first axis.

11. The electronic device of claim 10, wherein the at least one first bonding portion and the at least one second bonding portion are arranged at intervals along a second axis, and the first axis intersects the second axis.

12. The electronic device of claim 11, wherein the at least one first bonding portion is in one-to-one correspondence with the at least one second bonding portion, and each first bonding portion and a corresponding second bonding portion are symmetrical with each other with respect to an intersection point of the first axis and the second axis.

13. A bonding method for bonding a first substrate to a second substrate, the first substrate and the second substrate each comprising a bottom plate and at least one bonding portion disposed on the bottom plate, each bonding portion of the first substrate being bonded to a corresponding bonding portion of the second substrate, and each bonding portion of at least one of the first substrate and the second substrate taking a shape that is a part of an Archimedean spiral, the method comprising:
performing an initial alignment for the second substrate and the first substrate;
performing a second alignment for the second substrate; and
bonding each bonding portion of the first substrate to a corresponding bonding portion of the second substrate.

14. The bonding method of claim 13, wherein performing the initial alignment for the second substrate and the first substrate comprises:
aligning a first axis of the bottom plate of the second substrate with a first axis of the bottom plate of the first substrate and aligning a second axis of the bottom plate of the second substrate with a second axis of the bottom plate of the first substrate to perform the initial alignment.

15. The bonding method of claim 13, wherein performing the second alignment for the second substrate comprises:
rotating the second substrate by a first angle around a center point to perform the second alignment, wherein the center point is an intersection point of a first axis of the second substrate and a second axis of the second substrate.

16. The bonding method of claim 15, wherein rotating the second substrate by the first angle around the center point comprises:
rotating the second substrate clockwise around the center point by the first angle when an expansion coefficient of the bottom plate of the first substrate is smaller than that of the bottom plate of the second substrate; and
rotating the second substrate counterclockwise around the center point by the first angle when the expansion coefficient of the bottom plate of the first substrate is larger than that of the bottom plate of the second substrate.

17. The bonding method of claim 16, wherein
the first angle is expressed as $$\Delta \sigma = \frac{\Delta L}{b},$$

wherein $\Delta L = L - L'$, and b is a real number, wherein L is assumed to be a difference of the bonding portion of the first substrate caused by thermal expansion along a direction parallel to the second axis of the first substrate, wherein L' is assumed to be a difference of the bonding portion of the second substrate caused by thermal expansion along a direction parallel to the second axis of the second substrate.

* * * * *